United States Patent
Lee et al.

(10) Patent No.: US 9,489,298 B2
(45) Date of Patent: Nov. 8, 2016

(54) NONVOLATILE MEMORY APPARATUS, OPERATING METHOD THEREOF, AND DATA PROCESSING SYSTEM HAVING THE SAME

(71) Applicant: SK hynix Inc., Icheon-si, Gyeonggi-do (KR)

(72) Inventors: In Soo Lee, Icheon-si (KR); Ji Hyae Bae, Icheon-si (KR)

(73) Assignee: SK HYNIX INC., Icheon-si (KR)

(*) Notice: Subject to any disclaimer, the term of this patent is extended or adjusted under 35 U.S.C. 154(b) by 309 days.

(21) Appl. No.: 13/846,757

(22) Filed: Mar. 18, 2013

(65) Prior Publication Data
US 2014/0164682 A1    Jun. 12, 2014

(30) Foreign Application Priority Data
Dec. 12, 2012  (KR) .......................... 10-2012-0144310

(51) Int. Cl.
| | | |
|---|---|---|
| G06F 12/00 | (2006.01) | |
| G06F 13/00 | (2006.01) | |
| G06F 13/28 | (2006.01) | |
| G06F 12/02 | (2006.01) | |
| G11C 16/34 | (2006.01) | |

(52) U.S. Cl.
CPC ....... G06F 12/0246 (2013.01); G11C 16/3436 (2013.01); *G06F 2212/7209* (2013.01); *G11C 16/3459* (2013.01)

(58) Field of Classification Search
CPC .......... G06F 12/0246; G11C 16/3436; G11C 16/3454; G11C 16/3481
USPC ........................................ 711/103
See application file for complete search history.

(56) References Cited

U.S. PATENT DOCUMENTS

| | | | | |
|---|---|---|---|---|
| 6,147,910 A | * | 11/2000 | Hsu ..................... | G11C 11/5621 365/185.22 |
| 6,898,662 B2 | * | 5/2005 | Gorobets ............. | G06F 3/0613 365/189.08 |
| 6,967,892 B2 | * | 11/2005 | Tanaka ................ | G06F 11/1008 365/185.11 |
| 7,301,805 B2 | * | 11/2007 | Gorobets ............ | G11C 11/5628 365/185.02 |
| 7,490,283 B2 | * | 2/2009 | Gorobets et al. ............ | 714/763 |
| 7,539,062 B2 | * | 5/2009 | Doyle .................. | G11C 7/1042 365/185.22 |
| 7,567,461 B2 | * | 7/2009 | Roohparvar ............ | G11C 8/10 365/185.11 |
| 7,839,687 B2 | * | 11/2010 | Dutta ................... | G11C 11/5628 365/185.17 |
| 7,941,592 B2 | * | 5/2011 | Bonella ............... | G11C 11/5628 365/185.03 |
| 8,174,902 B2 | * | 5/2012 | Lee ..................... | G11C 16/0483 365/185.03 |
| 8,441,876 B2 | * | 5/2013 | Song ............................ | 365/201 |
| 8,621,323 B2 | * | 12/2013 | Gorobets et al. ............. | 714/763 |
| 8,645,617 B2 | * | 2/2014 | Shaeffer ................ | G11C 16/10 711/103 |
| 8,645,795 B2 | * | 2/2014 | Ishihara .............. | G06F 11/1048 365/100 |
| 8,677,053 B2 | * | 3/2014 | Bae et al. ...................... | 711/103 |
| 9,122,591 B2 | * | 9/2015 | Gorobets ............. | G11C 7/1039 |
| 2003/0065899 A1 | * | 4/2003 | Gorobets ....................... | 711/165 |

(Continued)

FOREIGN PATENT DOCUMENTS

KR    1020070035938 A    4/2007
KR    1020100073906 A    7/2010

*Primary Examiner* — Daniel C Chappell
(74) *Attorney, Agent, or Firm* — William Park & Associates Ltd.

(57) ABSTRACT

Provided is a nonvolatile memory apparatus which writes data into a memory cell according to a program and verify (PNV) operation, wherein the nonvolatile memory apparatus performs the PNV operation for first data during a first time, and performs a plurality of PNV operations for second data during the first time.

18 Claims, 6 Drawing Sheets

(56) References Cited

U.S. PATENT DOCUMENTS

| | | | |
|---|---|---|---|
| 2005/0257120 A1* | 11/2005 | Gorobets et al. | ............ 714/763 |
| 2005/0286336 A1* | 12/2005 | Harari et al. | ................ 365/232 |
| 2008/0055993 A1* | 3/2008 | Lee | .......................... G11C 5/02 |
| | | | 365/185.11 |
| 2008/0094912 A1* | 4/2008 | Incarnati | ............. G11C 11/5628 |
| | | | 365/185.22 |
| 2009/0125785 A1* | 5/2009 | Gorobets et al. | ............. 714/763 |
| 2009/0225600 A1* | 9/2009 | Park | .................... G11C 11/5628 |
| | | | 365/185.11 |
| 2011/0310685 A1* | 12/2011 | Song | ............................ 365/201 |
| 2014/0108886 A1* | 4/2014 | Gorobets et al. | ............. 714/764 |

* cited by examiner

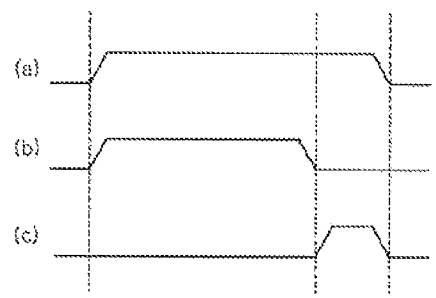
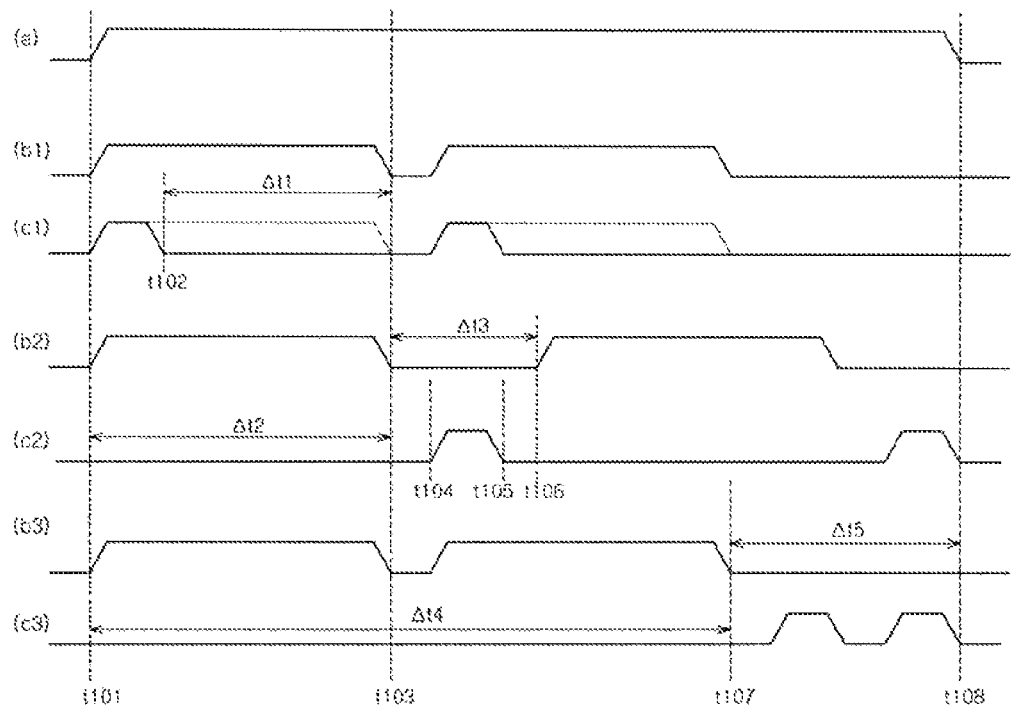

NONVOLATILE MEMORY APPARATUS, OPERATING METHOD THEREOF, AND DATA PROCESSING SYSTEM HAVING THE SAME

CROSS-REFERENCES TO RELATED APPLICATION

The present application claims priority under 35 U.S.C. §119(a) to Korean application number 10-2012-0144310, filed on Dec. 12, 2012, in the Korean Intellectual Property Office, which is incorporated herein by reference in its entirety.

BACKGROUND

1. Technical Field

The present invention generally relates to a semiconductor apparatus, and more particularly, to a nonvolatile memory apparatus, an operating method thereof, and a data processing system having is the same.

2. Related Art

A nonvolatile memory apparatus may include a flash memory, a phase change RAM (PCRAM), a resistive RAM (ReRAM), a magnetic RAM (MRAM) and the like. In particular, the PCRAM or MRAM is a nonvolatile memory apparatus which writes and senses data according to a current driving method.

During a program operation for a nonvolatile memory cell, a program and verify (PNV) operation is performed to accurately write data.

Particularly, in the nonvolatile memory apparatus based on the current driving method, a resistance distribution of each cell may deviate from a desired range after a program operation, due to various factors existing on a program path and a non-uniform resistance distribution of each cell. When the resistance distribution deviates from the desired range, a sensing margin may be degraded. In this case, it is impossible to guarantee the reliability of read data. Therefore, the program operation of the nonvolatile memory apparatus accompanies a verify process through which the resistance distribution of each cell is adjusted within the desired range.

In general, a PNV (program and verify) pulse (a) is enabled during one period of a data write operation, and a program pulse (b) is enabled to write data into a cell during a part of the PNV period. Furthermore, after the program pulse (b) is disabled, a verify and compare pulse (c) is enabled to check whether accurate data was written into the cell or not, thereby determining whether an additional program operation is required or not.

The nonvolatile memory apparatus has developed from a single-level cell (SLC) method to a multi-level cell (MLC) method. Regardless of whether the nonvolatile memory apparatus is implemented based on the SLC method or the MLC method, a PNV process for each data level is performed according to a predetermined timing.

Referring to FIG. 2, (a) represents a pulse which is enabled while all data are programmed into a memory cell array (t101 to t108), for example, a write enable pulse WE. Here, t101 to t108 may be timing periods. Further, (b1), (b2), and (b3) represent PNV pulses when data having a relatively long program time (for example, first data) are written, and (c1), (c2), and (c3) represent PNV pulses when data having a relatively short program time (for example, second data) are written.

Referring to (b1) and (c1), PNV pulses for writing first and second data is enabled at the same time as the pulse (a) is enabled at the time point t101. In this case, since a PNV time for the second data is relatively short, the PNV pulse for the second data is disabled at the time point t102, but the PNV pulse for the first data is disabled at the time point t103.

Therefore, during a time Δt1 required until the PNV pulse for the first data is disabled after the PNV pulse for the second data is disabled, devices to perform a program operation for the second data is are in a waiting state.

Referring to (b2) and (c2), a PNV pulse for the first data is enabled to perform a PNV operation at the time point t101. At this time, a PNV pulse for the second data is disabled. After the PNV pulse for the first data is disabled at the time point t103, the PNV pulse for the second data is enabled to perform a PNV operation for the second data from the time point t104 to the time point t105. Then, the PNV pulse for the first data is enabled again at the time point t106.

In this case, while the PNV operation for the first data is performed (Δt2), devices to perform the PNV operation for the second data are in a waiting state, and while the PNV operation for the second data is performed (Δt3), devices to perform the PNV operation for the first data are in a waiting state.

Referring to (b3) and (c3), after a PNV operation for the first data is completed (t101~t107), a PNV operation for the second data is performed (t107~t108). Therefore, during a time Δt4, the devices to perform the PNV operation for the second data are in a waiting state, and during a time Δt5, the devices to perform the PNV operation for the first data are in a waiting state.

In this PNV method, after the program operations for all data are completed, the verify operations are performed at a time or the data are reprogrammed (b1 and c1). The PNV operation is alternately performed for the respective data levels (b2 and c2). Alternatively, after a PNV operation for any one data level is completed, a PNV operation for another data level is performed (b3 and c3).

Therefore, when data having a short program time is programmed and verified, the next PNV operation is performed after a program operation for data having a long program time is ended. Therefore, a long time is required for the program operation. In order to accurately write data, the number of PNV operations is inevitably increased. As the number of PNV operations is increased, the waiting time is accumulated to increase the entire PNV time. Accordingly, the performance of the entire system may be degraded.

SUMMARY

In one embodiment of the present invention, there is provided a nonvolatile memory apparatus which writes data into a memory cell according to a PNV method, wherein the nonvolatile memory apparatus performs a PNV operation for first data during a first time, and performs a plurality of PNV operations for second data during the first time.

In an embodiment of the present invention, a nonvolatile memory apparatus includes: a memory cell array including a plurality of memory cells connected between a plurality of word lines and bit lines; a decoder configured to select a word line and a bit line which are connected to a memory cell to be selected; a write driver/sense amplifier (WD/SA) circuit configured to write data into a selected memory cell and read data from a selected memory cell; a is determination unit configured to determine whether or not to repeat a PNV operation for each level of data to be programmed during a program mode, and generate a flag signal; and a controller configured to control the decoder and the WD/SA circuit to selectively access a memory cell for each level of the data, in response to the flag signal.

In an embodiment of the present invention, an operating method of a nonvolatile memory apparatus includes the steps of: entering a program mode, as an address, data, and a program command are transmitted from a host; performing a PNV operation for first data to be programmed during a first time; and performing a plurality of PNV operations for second data to be programmed during the first time.

In an embodiment of the present invention, a data processing system includes: a nonvolatile memory apparatus; and a memory controller configured to access the nonvolatile memory apparatus in response to a request of a host, wherein the nonvolatile memory apparatus writes data into a memory cell according to a PNV method, performs a PNV operation for first data during a first time, and performs a plurality of PNV operations for second data during the first time.

In an embodiment of the present invention, a data processing system includes: a processor configured to control overall operations; a working memory configured to store applications, data, and control signals, which are required for operating the processor; a is nonvolatile memory apparatus accessed by the processor; and a user interface configured to perform a data I/O between the processor and a user, wherein the nonvolatile memory apparatus writes data into a memory cell according to a PNV method, performs a PNV operation for first data during a first time, and performs a plurality of PNV operations for second data during the first time.

BRIEF DESCRIPTION OF THE DRAWINGS

Features, aspects, and embodiments are described in conjunction with the attached drawings, in which:

FIG. 1 is a timing diagram for explaining a general PNV pulse;

FIG. 2 is a timing diagram for explaining a general PNV process;

DETAILED DESCRIPTION

Hereinafter, a nonvolatile memory apparatus, an operating method thereof, and a data processing system having the same according to the present invention will be described below with reference to the accompanying drawings through exemplary embodiments.

Figure 3:
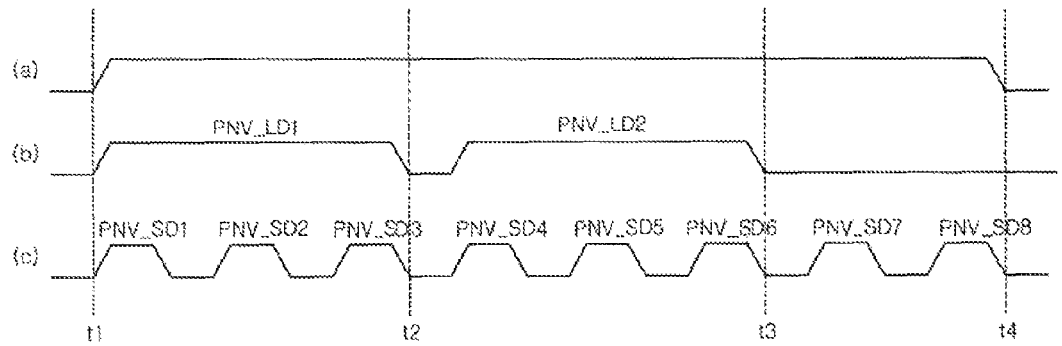
FIG. 3 is a timing diagram for explaining a PNV process according to one embodiment of the present invention.

Referring to FIG. 3, a nonvolatile memory apparatus may be configured to perform two or more PNV operations for second data during a PNV time for first data in a program mode.

For convenience of description, suppose that the first data is programmed at low speed and the second data is programmed at high speed. Then, the PNV time for the first data may be inevitably longer than the PNV time for the second data.

Therefore, as a write enable signal (a) for entering a program mode may be enabled at a point t1, a PNV operation for the first data may be started, and a first PNV operation PNV_LD1 for the first data may be ended at a point t2. At this time, since the second data has a high program speed, two or more PNV operations may be performed during the period (t1~t2). In FIG. 3, three PNV operations PNV_SD1, PNV_SD2, and PNV_SD3 for the second data are performed during the period (t1~t2).

Furthermore, the point when the nonvolatile memory apparatus enters the program mode for the second data may or may not be synchronized with the time point when the nonvolatile memory apparatus enters the program mode for the first data.

Even during a second PNV operation PNV_LD2 (t2~t3) for the first data, a plurality of PNV operations PNV_SD4, PNV_SD5, and PNV_SD6 for the second data may be performed.

When the program operation may be passed after the second PNV operation PNV_LD2 for the first data, the PNV process for the first data may be ended. When the program operation may be failed after the PNV operation PNV_SD6 for the second data, additional PNV operations PNV_SD7 and PNV_SD8 for the second data are performed, and the entire program operation is ended.

As such, during the PNV period of the data requiring a relatively long program time (for example, data having a logic level of 0 and data of which all bits are 0 in the case of MLC) in the program mode, a plurality of PNV operations for the data requiring a relatively short program time (for example, data having a logic level of 1 and data of which any one bit is 1 in the case of MLC) may be performed. Therefore, it is possible to guarantee reliability of data requiring a short program time. In particular, when the program reliability of the data requiring a long program time is lower than the program reliability of the data requiring a short program time, it is possible to improve the program reliability and the program speed.

Figure 4:
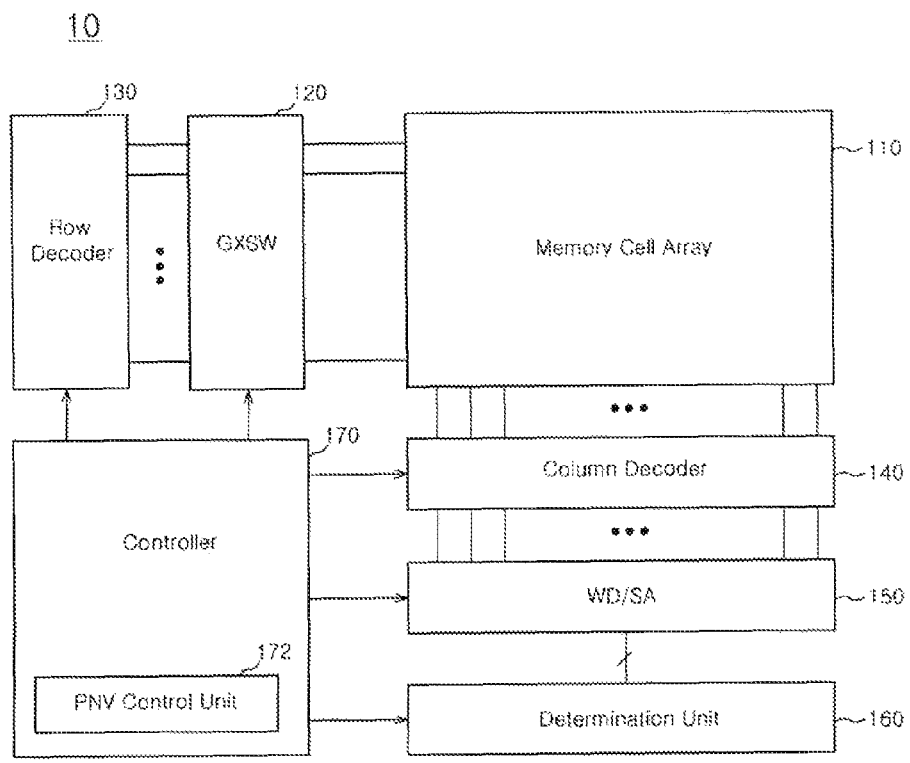
FIG. 4 is a block diagram of a nonvolatile memory apparatus according to the embodiment of the present invention.

Referring to FIG. 4, the nonvolatile memory apparatus 10 may include a memory cell array 110, a global word line switch (GXSW) 120, a row decoder 130, a column decoder 140, a write driver/sense amplifier (WD/SA) circuit 150, a determination unit 160, and a controller 170.

The memory cell array 110 may include a plurality of unit memory cells, for example, a plurality of nonvolatile memory cells electrically connected between a plurality of word lines and a plurality of bit lines, respectively. Furthermore, the memory cell array 110 may be configured as one or more blocks, and each memory cell may be implemented as an SLC or MLC.

The GXSW (global word line switch) 120 may be electrically connected to the respective word lines, and controlled by a block select signal provided from a block decoder (not shown) so as to provide a path for providing a preset word line voltage to a selected memory cell and an unselected memory cell.

The row decoder 130 and the column decoder 140 may be configured to select a word line and a bit line, respectively, according to an address signal provided from the controller 170.

The WD/SA circuit 150 may be configured to receive data provided from the controller 170 through an input circuit (not shown) and write the received data into the memory cell array 110 during a program operation of the program mode. Furthermore, the WD/SA circuit 150 may be configured to read data from the memory cell is array 110 during a verify operation of the read mode or program mode.

The determination unit 160 may be configured to read data written in the memory cell array 110 in response to a verify command, compare the read data to data to be written (hereafter, referred to as write data), generate a flag signal based on the comparison result, and provide the generated flag signal to the controller 170, during the program mode. The flag signal may include information on whether or not an additional PNV operation is required for each level of data to be programmed.

The controller 170 may be configured to receive an address from a host (not shown), and control the peripheral circuits 120 to 150 to transmit the data read from the memory cell array 110 to the host, during the read mode.

In addition, the controller 170 may be configured to receive an address and data from the host during the program mode. The controller 170 may include a PNV control unit 172 configured to control the peripheral circuits 120 to 160 of the memory cell array 110 to write data into the memory cell array 110. In particular, the PNV control unit 172 may independently perform the program operation for each level of the write data in response to the flag signal received from the determination unit 160 during a verify operation of the program mode.

More specifically, when the PNV operation needs to be repeated for each level of data to be programmed according to the flag signal provided from the determination unit 160, the PNV control unit 172 may control the PNV operation to be performed in a memory cell into which the corresponding data is to be written. When the PNV operation does not need to be repeated, the PNV control unit 172 may control the PNV operation to not be performed any more. For this operation, the PNV control unit 172 independently performs the PNV operation for the corresponding memory cell according to the information on whether the PNV operation for each data level is repeated or not, which is indicated by the flag signal, referring to the address and data provided to the controller 170 during the program mode.

Figure 5:
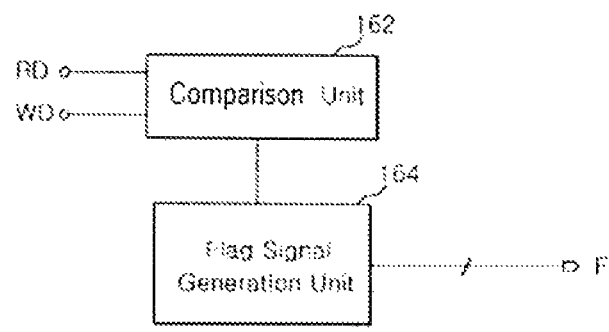
FIG. 5 is a block diagram of a determination unit of FIG. 4.

Referring to FIG. 5, the determination unit 160 may include a comparison unit 162 and a flag signal generation unit 164.

When the nonvolatile memory apparatus enters the program mode, the WD/SA circuit 150 may write data provided from the controller 170 into a designated memory cell of the memory cell array 110. At this time, the data provided from the controller 170 is a write data WD. Then, when a verify command is enabled, the comparison unit 162 may receive data RD written in the memory cell array 110 through the WD/SA circuit 150. Furthermore, the comparison unit 162 may receive write data WD from the controller 170, and compare the write data WD to the received data RD.

The flag signal generation unit 164 may be configured to generate a flag signal F including the comparison result of the comparison unit 162.

The comparison unit 162 may read data from the memory cell array 110 for each level of the write data WD and compare the read data RD to the write data WD, according to the control of the controller 170. For example, suppose that first-level data are to be written into a first cell group of the memory cell array 110 and second-level data are to be written into a second cell group of the memory cell array 110. After the first and second data may be written into the first and second cell groups, respectively, according to a program command, the comparison unit 162 may receive the first data from the controller 170, read data from the first cell group of the memory cell array 110, and compare the first data to the read data. The comparison unit 162 may receive the second data from the controller 170, read data from the second cell group, and compare the second data to the read data.

The flag signal generation unit 164 may generate a flag signal F with information on whether or not an additional PNV operation is required and a program direction, according to the comparison result of the comparison unit 162.

That is, when the read data RD and the write data WD may be identical to each other as the comparison result of the comparison unit 162, the flag signal generation unit 164 generates a flag signal F to indicate that the PNV repetition is not required. When the PNV repetition is required as the comparison result of the comparison unit 162, the flag signal generation unit 164 generates a flag signal F to indicate that the PNV repetition is required or whether to increase or is decrease a current or voltage to be applied. Since a general PNV operation may be performed while gradually increasing or decreasing a current or voltage, whether to increase or decrease a current or voltage is determined according to the level of the read data RD.

Further, the flag signal generation unit 164 may generate a flag signal F every level of the write data WD. That is, the flag signal generation unit 164 may generate a flag signal for the first data and a flag signal for the second data, respectively. Therefore, a plurality of flag signals F (for example, first and second flag signals) may be generated, and each of the flag signals F may include a signal having one or more bits. Further, the flag signal generation unit 164 may generate one flag signal for all data. In this case, the flag signal F may include a multi-bit single signal.

Figure 6:
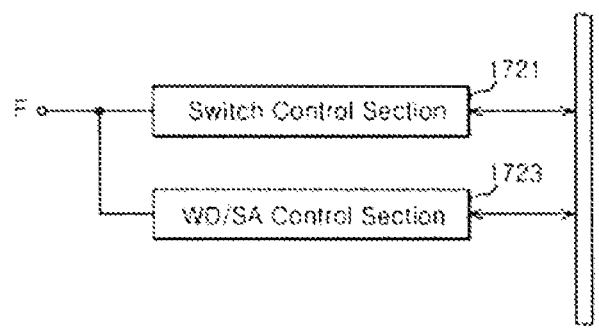
FIG. 6 is a block diagram of a PNV control unit of FIG. 4.

Referring to FIG. 6, the PNV control unit 172 may include a switch control section 1721 and a WD/SA control section 1723.

During a first program operation after entering the program mode, the switch control section 1721 and the WD/SA control section 1723 may be controlled to perform a program operation for a corresponding memory cell according to an address and data provided from the controller 170.

Then, when the flag signal F including information on whether or not to repeat a PNV operation is provided to the PNV control unit 172, the switch control section 1721 may drive a word line connected to the memory cell in which the PNV operation is to be performed, in response to the flag signal F. Furthermore, the WD/SA is control section 1723 may drive a WD/SA connected to the memory cell in which the PNV operation is to be performed, in response to the flag signal F.

As described with reference to FIG. 5, the flag signal F includes information on whether or not to repeat the PNV operation for each level of the write data WD. Therefore, the write data WD may be independently accessed to a corresponding memory cell in which the data is written according to the flag signal, thereby repeatedly performing the PNV operation.

In other words, when the PNV operation for the first-level data is required to be repeated, the switch control section 1721 may control the GXSW 120 and the WD/SA control section 1723 may control the WD/SA circuit 150 to access the first cell group into which the first-level data is to be written. When the PNV operation for the second-level data is required to be repeated, the switch control section 1721 may control the GXSW 120 and the WD/SA control section 1723 may control the WD/SA circuit 150 to access the second cell group into which the second-level data is to be written and to perform the PNV operation.

Furthermore, after the PNV operation is repeated for the respective data levels, the determination unit 160 may operate regardless of a PNV operation for different data levels, and determines whether or not to repeat the PNV operation for the respective data levels.

Figure 7:
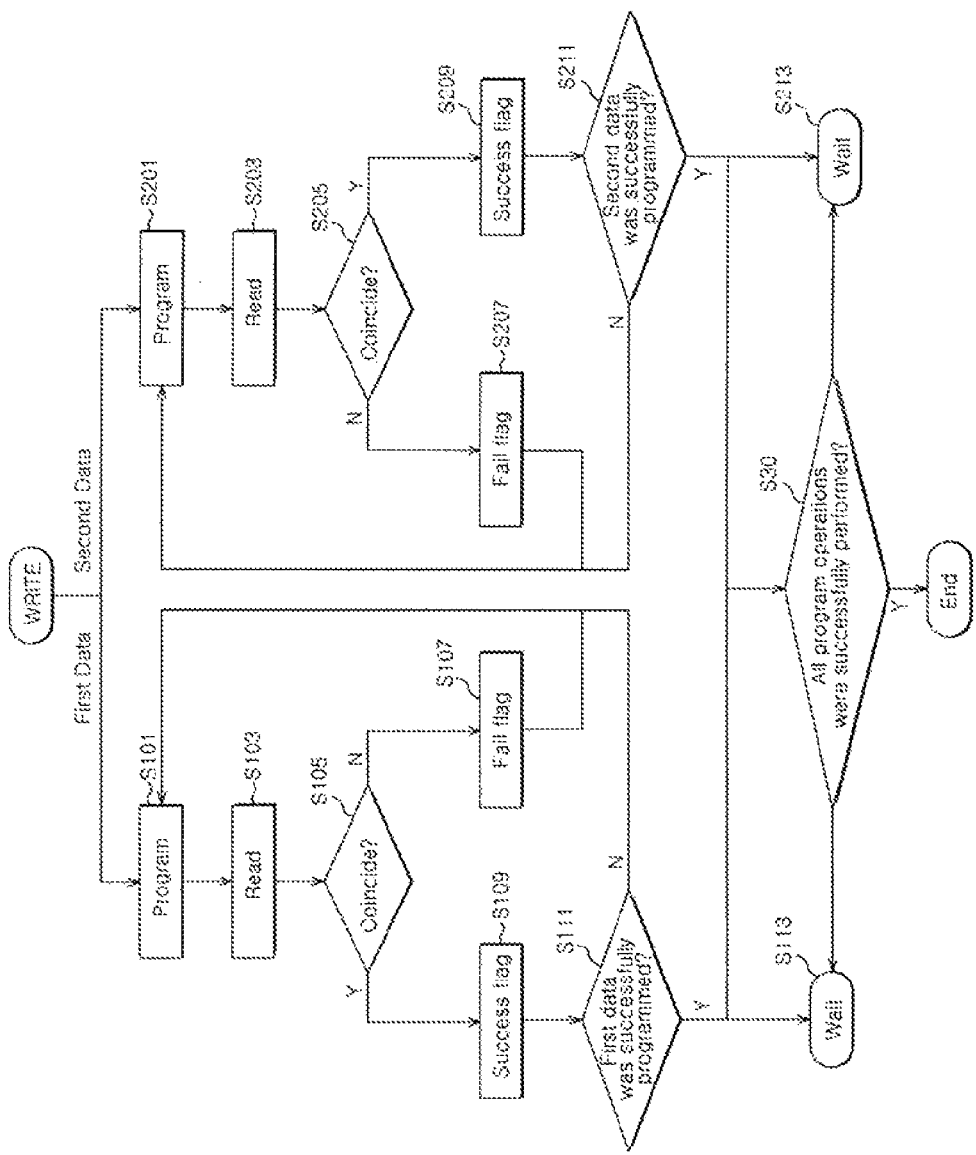
FIG. 7 is a flowchart for explaining an operating method of the nonvolatile memory apparatus according to the embodiment of the present invention.

Referring to FIG. 7, as the nonvolatile memory apparatus enters the program mode WRITE, PNV operations for first data WD1 and second data WD2 may be independently performed.

First, a case in which the first data WD1 is programmed will be described. As an address and data are transmitted to the controller 170, a memory cell corresponding to the address at which the first data WD1 is to be written may be accessed to perform a program operation, according to the control of the PNV control unit 172, at step S101. After the program operation is performed, a read operation for verification may be performed at step S103. At this time, the PNV control unit 172 may control the GXSW 120 and the WD/SA circuit 150 to access only the memory cell into which the first data is to be written and to read data.

Accordingly, when the data is read, the determination unit 160 may generate a flag according to a comparison result between the first data WD1 and the data RD1 read through the WD/SA circuit 150 controlled by the PNV control unit 172, at step S105. When the write data WD and the read data RD do not coincide with each other (WD1≠RD1) as the comparison result, the determination unit 160 may generate a fail flag at step S107. Accordingly, the PNV control unit 172 may control the PNV operation to be repeated for memory cells into which the first data is to be written.

When the write data WD and the read data RD coincide with each other (WD1=RD1) as the comparison result, the determination unit 160 may generate a success flag at step S109. Furthermore, whether or not the program operation for the first data was is successfully performed for each program unit (for example, page or block) is checked at step S111. When the program operation for the first data was successfully performed for each program unit, the procedure proceeds to a waiting state at step S113. Otherwise, the PNV operation is repeated for a block in which a fail occurred.

For the second data which is programmed independently of the first data, a similar process is performed.

That is, as an address and data are transmitted to the controller 170, a memory cell corresponding to the address at which the second data WD2 is to be written may be accessed to perform a program operation, according to the control of the PNV control unit 172, at step S201. After the program operation is performed, a read operation for verification may be performed at step S203. At this time, the PNV control unit 172 may control the GXSW 120 and the WD/SA circuit 150 to access only the memory cell into which the second data may be to be written and to read data.

Accordingly, when the data is read, the determination unit 160 may generate a flag according to a comparison result between the second data WD2 and the data RD2 read through the WD/SA circuit 150 controlled by the PNV control unit 172, at step S205. When the write data WD and the read data RD do not coincide with each other (WD2≠RD2) as the comparison result, the determination unit 160 may generate a fail flag at step S207. Accordingly, the PNV control unit 172 may control the PNV operation to be repeated for memory cells into which the second data is to be written.

When the write data WD and the read data RD coincide with each other (WD2=RD2) as the comparison result, the determination unit 160 generates a success flag at step S209. Furthermore, whether or not the program operation for the second data was successfully performed for each program unit (for example, page or block) is checked at step S211. When the program operation for the second data was successfully performed for each program unit, the procedure proceeds to a waiting state at step S213. Otherwise, the PNV operation is repeated for a block in which a fail occurred.

Furthermore, whether the program operations for the first and second data were successfully performed or not is checked at step S30. When the program operations for the first and second data were successfully performed, the program mode is ended. Otherwise, the procedure proceeds to a waiting state at steps S113 and 213.

Such a program operation will be described with reference to FIG. 8.

For example, suppose that the first data is data requiring a relatively long program time and the second data is data requiring a relatively short program time.

As a write enable signal (a) is enabled to enter the program mode, a program operation for the first data is performed by the control of the PNV control unit 172, and a success flag may be generated at step S109 according to the comparison result of step S105 of FIG. 7 by the determination unit 160. Then, since the PNV repetition for the corresponding program unit is not necessary, the first data may be written during a time based on a first PNV pulse <1>, and a second PNV pulse <2> is not generated.

A program operation for the second data is performed independently of the program operation for the first data. In particular, during the time (t11~t12) in which the first PNV pulse for the first data is generated, first to third PNV pulses ①, ②, and ③ for the second data may be generated to increase the number of PNV operations for the second data until the write data and the read data coincide with each other. When the write data and the read data do not coincide with each other even after the PNV operation for the third PNV pulse ③ for the second data, PNV pulses ④, ⑤, and ⑥ may be generated to repeat the PNV operation until the two data coincide with each other. Furthermore, when the PNV operation for the second data is successfully performed after the sixth PNV pulse 8, the following PNV pulses ⑦ and ⑧ are not generated.

When the PNV operation for the first data and the PNV operation for the second data are performed in the conventional manner, only one PNV operation for the second data can be performed during the PNV operation for the first data. Therefore, in the case of FIG. 8, the PNV operation is performed during a time at least six times larger than the PNV pulse generation time for the first data.

In this embodiment of the present invention, however, since a plurality of PNV operations for the second data may be performed while the PNV operation for the first data is performed, it is possible to significantly reduce the time required for the PNV operation.

As the number of PNV operations increases, the precision of the program operation may be increased. In particular, the program reliability for data having a high level may be improved.

Figure 8:
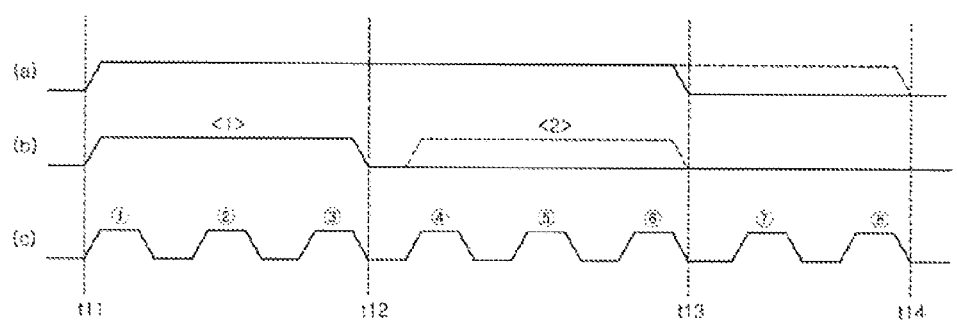
FIG. 8 is a timing diagram for explaining a PNV process based on flag generation according to the embodiment of the present is invention.

Meanwhile, FIG. 8 illustrates a case in which the end time point of the first PNV pulse <1> for the first data coincides with the end time point of the sixth PNV pulse ⑥ for the second data. This is only an example. That is, since the PNV operations for the first and second data are independently performed, the end time points of the PNV pulses for the write data WD and the read data RD may not coincide with each other.

Figure 9:
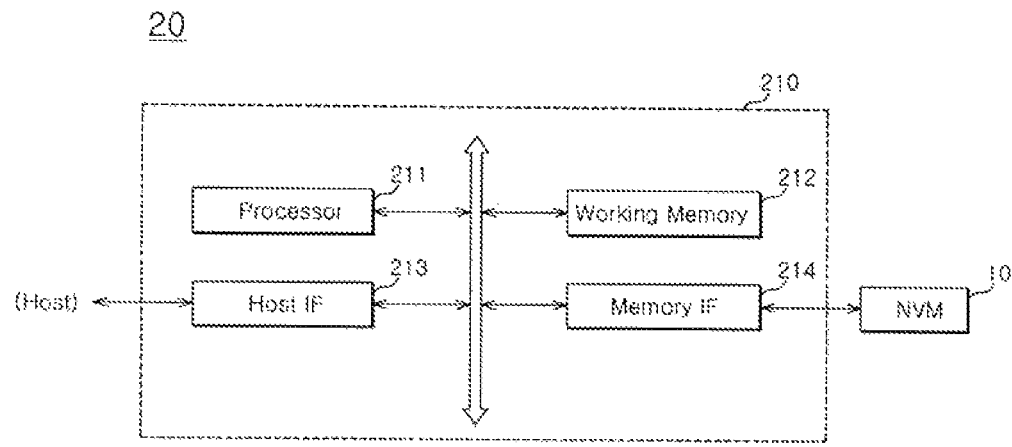
FIG. 9 is a block diagram of a data processing system according to the embodiment of the present invention.

Referring to FIG. 9, the data processing system 20 may include a memory controller 210 connected between a host and a nonvolatile memory apparatus 10.

The memory controller 210 may be configured to access the nonvolatile memory apparatus 10 in response to a request of the host, and may include a processor 211, a working memory 212, a host interface 213, and a memory interface 214.

The processor 211 may control overall operations of the memory controller 210, and the working memory 212 may store applications, data, control signals and the like, which are required for operating the memory controller 210.

The host interface 213 may serve to convert a protocol for exchanging data/control signals between the host and the memory controller 210, and the memory interface 214 serves to convert a is protocol for exchanging data/control signals between the memory controller 210 and the nonvolatile memory apparatus 10.

The nonvolatile memory apparatus 10 may include the apparatus illustrated in FIG. 4, for example. Therefore, an independent PNV operation may be performed for each data level in the program mode, which makes it possible to improve the program speed and reliability.

In the embodiment of the present invention, the data processing system illustrated in FIG. 9 may include a memory card, but the present invention is not limited thereto.

Figure 10:
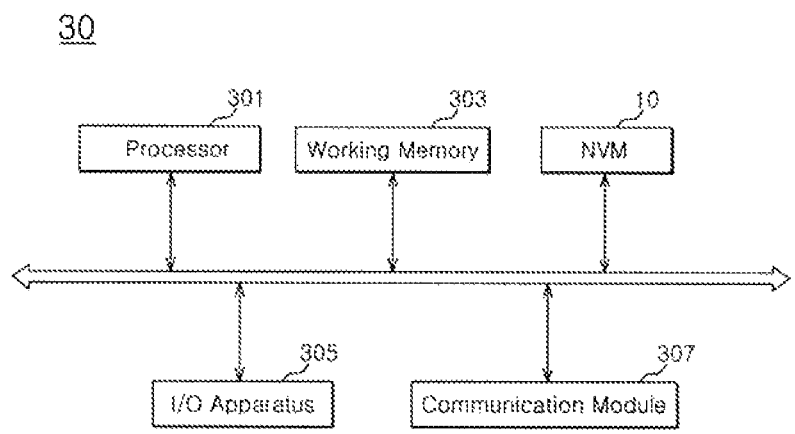
FIG. 10 is a block diagram of a data processing system according to another embodiment of the present invention.

Referring to FIG. 10, the data processing system 30 may include a nonvolatile memory apparatus 10, a processor 301, a working memory 303, and an I/O (Input/Output) apparatus 305. If necessary, the data processing system 30 may further include a communication module 307.

The processor 301 may include a central processing unit (CPU), and the working memory 303 may store application programs, data, control signals and the like, which are required for operating the data processing system 30. The I/O apparatus 305 provides an environment in which a user can access the data processing system 30, and provides a data processing process and result of the data processing system 30 to the user.

The nonvolatile memory apparatus 10 may include the apparatus illustrated in FIG. 4, for example. Therefore, an independent PNV operation may be performed for each data level in is the program mode, which makes it possible to improve the program speed and reliability.

The data processing systems illustrated in FIGS. 9 and 10 may be utilized as a disc device, used as an internal/external memory card of a mobile electronic device, or used as an image processor and other application chips.

While certain embodiments have been described above, it will be understood to those skilled in the art that the embodiments described are by way of example only. Accordingly, the nonvolatile memory apparatus described herein should not be limited based on the described embodiments. Rather, the nonvolatile memory apparatus described herein should only be limited in light of the claims that follow when taken in conjunction with the above description and accompanying drawings.

What is claimed is:

1. A nonvolatile memory apparatus which writes data into a memory cell through a program and verify (PNV) operation, comprising:
    a circuit device that performs a first PNV operation for first data during a first time period and that performs a plurality of second PNV operations for second data simultaneously during the first time period, wherein the first PNV operation and the plurality of second PNV operations are performed in parallel,
    wherein the first data is programmed at low speed and the second data is programmed at high speed, and
    the first PNV operation is performed only once all through the first time period, and the plurality of second PNV operations is performed from the beginning of the first time period until the end of the first time period,
    wherein the first time period is the time during which a first PNV pulse for the first PNV operation is maintaining an enable state for writing the first data, and a second PNV pulse for the plurality of second PNV operations is enabled a plurality of times sequentially for writing the second data during the first time period.

2. The nonvolatile memory apparatus according to claim 1, wherein the circuit device comprises:
    a determination unit that generates a flag signal depending on whether or not to repeat the PNV operation for each level of data to be programmed during a program mode; and
    a controller that controls the memory cell to be selectively accessed for each level of the data in response to the flag signal.

3. The nonvolatile memory apparatus according to claim 2, wherein the controller controls a memory cell, into which the first data is to be written, to be selectively accessed in response to a flag signal to repeat the first PNV operation.

4. The nonvolatile memory apparatus according to claim 2, wherein the controller controls a memory cell, into which the second data is to be written, to be selectively accessed in response to a flag signal to repeat the second PNV operation.

5. A nonvolatile memory apparatus comprising:
    a memory cell array comprising a plurality of memory cells connected between a plurality of word lines and bit lines;
    a decoder that selects a word line and a bit line which are connected to a memory cell to be selected;
    a write driver/sense amplifier (WD/SA) circuit that writes data into a selected memory cell and reads data from a selected memory cell;
    a determination unit that determines whether or not to repeat a program and verify (PNV) operation for each level of data to be programmed during a program mode and that generates a flag signal; and
    a controller that controls the decoder and the WD/SA circuit to selectively access a memory cell for each level of the data in response to the flag signal,
    wherein the data to be programmed comprises first data and second data,
    the controller controls a first PNV operation for the first data during a first time period in response to the flag signal, and controls a plurality of second PNV operations for the second data simultaneously during the first time period, wherein the first PNV operation and the plurality of second PNV operations are performed in parallel,
    the first data is programmed at low speed and the second data is programmed at high speed, and the first PNV operation is performed only once all through the first time period, the plurality of second PNV operations is performed from the beginning of the first time period until the end of the first time period, wherein the first time period is the time during which a first PNV pulse for the first PNV operation is maintaining an enable state for writing the first data, and a second PNV pulse for the plurality of second PNV operations is enabled a plurality of times sequentially for writing the second data during the first time period.

6. The nonvolatile memory apparatus according to claim 5, wherein the determination unit generates a first flag signal for the first data and a second flag signal for the second data.

7. The nonvolatile memory apparatus according to claim 6, wherein the controller controls the decoder and the WD/SA circuit to select a memory cell into which the first data is to be written, in response to the first flag signal.

8. The nonvolatile memory apparatus according to claim 6, wherein the controller controls the decoder and the WD/SA circuit to select a memory cell into which the second data is to be written, in response to the second flag signal.

9. A data processing system comprising:
a nonvolatile memory apparatus; and
a memory controller that accesses the nonvolatile memory apparatus in response to a request from a host,
wherein the nonvolatile memory apparatus writes data into a memory cell according to a program and verify (PNV) operation, performs a first PNV operation for first data during a first time period, and performs a plurality of second PNV operations for second data simultaneously during the first time period, wherein the first PNV operation and the plurality of second PNV operations are performed in parallel,
wherein the first data is programmed at low speed and the second data is programmed at high speed, and
the first PNV operation is performed only once all through the first time period, and the plurality of second PNV operations is performed from the beginning of the first time period until the end of the first time period,
wherein the first time period is the time during which a first PNV pulse for the first PNV operation is maintaining an enable state for writing the first data, and a second PNV pulse for the plurality of second PNV operations is enabled a plurality of times sequentially for writing the second data during the first time period.

10. The data processing system according to claim 9, wherein the nonvolatile memory apparatus comprises:
a determination unit that generates a flag signal depending on whether or not to repeat the first PNV operation or the plurality of second PNV operations for each level of data to be programmed during a program mode; and
a controller that controls the memory cell to be selectively accessed for each level of the data in response to the flag signal.

11. The data processing system according to claim 10, wherein the controller controls a memory cell, into which the first data is to be written, to be selectively accessed in response to a flag signal to repeat the first PNV operation.

12. The data processing system according to claim 10, wherein the controller controls a memory cell, into which the second data is to be written, to be selectively accessed in response to a flag signal to repeat the second PNV operation.

13. A data processing system comprising:
a processor that controls overall operations;
a working memory that stores applications, data, and control signals which are required for operating the processor;
a nonvolatile memory apparatus accessed by the processor; and
a user interface that performs a data input/output between the processor and a user,
wherein the nonvolatile memory apparatus writes data into a memory cell according to a program and verify (PNV) operation, performs a first PNV operation for first data during a first time period, and performs a plurality of second PNV operations for second data simultaneously during the first time period, wherein the first PNV operation and the plurality of second PNV operations are performed in parallel,
wherein the first data is programmed at low speed and the second data is programmed at high speed, and
the first PNV operation is performed only once all through the first time period, and the plurality of second PNV operations is performed from the beginning of the first time period until the end of the first time period,
wherein the first time period is the time during which a first PNV pulse for the first PNV operation is maintaining an enable state for writing the first data, and a second PNV pulse for the plurality of second PNV operations is enabled a plurality of times sequentially for writing the second data during the first time period.

14. The data processing system according to claim 13, wherein the nonvolatile memory apparatus comprises:
a determination unit that generates a flag signal depending on whether or not to repeat the first PNV operation or the second PNV operation for each level of data to be programmed during a program mode; and
a controller that controls the memory cell to be selectively accessed for each level of the data in response to the flag signal.

15. The data processing system according to claim 14, wherein the controller controls a memory cell, into which the first data is to be written, to be selectively accessed in response to a flag signal to repeat the first PNV operation and
wherein the controller controls a memory cell, into which the second data is to be written, to be selectively accessed in response to a flag signal to repeat the second PNV operation.

16. An operating method of a nonvolatile memory apparatus, comprising the steps of:
entering a program mode, as an address, data, and a program command are transmitted from a host;
performing a first program and verify (PNV) operation for first data to be programmed during a first time period; and
simultaneously performing a plurality of second PNV operations for second data to be programmed during the first time period, wherein the first PNV operation and the plurality of second PNV operations are performed in parallel,
wherein the first data is programmed at low speed and the second data is programmed at high speed, and
the first PNV operation is performed only once all through the first time period, the plurality of second PNV operations is performed from the beginning of the first time period until the end of the first time period,
wherein the first time period is the time during which a first PNV pulse for the first PNV operation is maintaining an enable state for writing the first data, and a second PNV pulse for the plurality of second PNV operations is enabled a plurality of times sequentially for writing the second data during the first time period.

17. The operating method according to claim 16, further comprising the steps of:

generating a first flag signal according to a verify result for the first data;

and selectively accessing a memory cell into which the first data is to be written and repeating the first PNV operation, according to the first flag signal.

18. The operating method according to claim 17, further comprising the steps of:

generating a second flag signal according to a verify result for the second data; and selectively accessing a memory cell into which the second data is to be written and repeating the second PNV operation, according to the second flag signal.

* * * * *